United States Patent
Rozenzon et al.

(10) Patent No.: US 10,008,368 B2
(45) Date of Patent: Jun. 26, 2018

(54) MULTI-ZONE GAS INJECTION ASSEMBLY WITH AZIMUTHAL AND RADIAL DISTRIBUTION CONTROL

(71) Applicant: APPLIED MATERIALS, INC., Santa Clara, CA (US)

(72) Inventors: Yan Rozenzon, San Carlos, CA (US); Kyle Tantiwong, Livermore, CA (US); Imad Yousif, San Jose, CA (US); Vladimir Knyazik, Santa Clara, CA (US); Bojenna Keating, Palo Alto, CA (US); Samer Banna, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 408 days.

(21) Appl. No.: 14/762,219

(22) PCT Filed: Feb. 3, 2014

(86) PCT No.: PCT/US2014/014389
§ 371 (c)(1),
(2) Date: Jul. 21, 2015

(87) PCT Pub. No.: WO2014/163742
PCT Pub. Date: Oct. 9, 2014

(65) Prior Publication Data
US 2015/0371831 A1    Dec. 24, 2015

Related U.S. Application Data

(60) Provisional application No. 61/777,225, filed on Mar. 12, 2013.

(51) Int. Cl.
*H01J 37/32* (2006.01)
*C23C 16/455* (2006.01)

(52) U.S. Cl.
CPC .. *H01J 37/32449* (2013.01); *C23C 16/45561* (2013.01); *C23C 16/45563* (2013.01); *C23C 16/45578* (2013.01); *H01J 37/3244* (2013.01)

(58) Field of Classification Search
CPC ............ H01J 37/32449; H01J 37/3244; C23C 16/45561; C23C 16/45563; C23C 16/45578
See application file for complete search history.

(56) References Cited

U.S. PATENT DOCUMENTS

| | | | |
|---|---|---|---|
| 5,000,113 A * | 3/1991 | Wang | C23C 16/402 118/715 |
| 5,188,671 A * | 2/1993 | Zinck | C30B 23/06 118/715 |

(Continued)

FOREIGN PATENT DOCUMENTS

| | | | |
|---|---|---|---|
| JP | 2006-066855 | 3/2006 | |
| WO | WO-2012002232 A1 * | 1/2012 | ........ H01J 37/32192 |

OTHER PUBLICATIONS

International Search Report and Written Opinion in International Application No. PCT/US2014/014389, dated May 20, 2014, 11 pages.

(Continued)

*Primary Examiner* — Jeffrie R Lund
(74) *Attorney, Agent, or Firm* — Fish & Richardson P.C.

(57) ABSTRACT

A gas injection system includes (a) a side gas plenum, (b) a plurality of N gas inlets coupled to said side gas plenum, (c) plural side gas outlets extending radially inwardly from said plenum, (d) an N-way gas flow ratio controller having N outputs coupled to said N gas inlets respectively, and (e) an M-way gas flow ratio controller having M outputs, respec- (Continued)

tive ones of said M outputs coupled to said tunable gas nozzle and a gas input of said N-way gas flow ratio controller.

27 Claims, 14 Drawing Sheets

(56) References Cited

U.S. PATENT DOCUMENTS

| | | | |
|---|---|---|---|
| 5,522,934 A * | 6/1996 | Suzuki | C23C 16/455 118/723 AN |
| 5,614,055 A * | 3/1997 | Fairbairn | H01J 37/321 118/723 AN |
| 5,622,606 A * | 4/1997 | Kugler | C23C 14/0063 204/192.12 |
| 5,746,834 A * | 5/1998 | Hanley | C23C 16/4401 118/715 |
| 5,772,771 A * | 6/1998 | Li | C23C 16/4405 118/715 |
| 5,846,330 A * | 12/1998 | Quirk | C23C 16/4558 118/715 |
| 5,851,294 A * | 12/1998 | Young | C23C 16/45508 118/715 |
| 5,885,358 A * | 3/1999 | Maydan | C23C 16/455 118/715 |
| 5,948,168 A * | 9/1999 | Shan | C23C 16/452 118/50.1 |
| 5,992,453 A * | 11/1999 | Zimmer | B05C 1/10 137/561 A |
| 6,013,155 A * | 1/2000 | McMillin | C23C 16/455 118/723 I |
| 6,143,078 A * | 11/2000 | Ishikawa | H01L 21/67017 118/715 |
| 6,178,918 B1 * | 1/2001 | van Os | C23C 16/4405 118/715 |
| 6,200,412 B1 * | 3/2001 | Kilgore | C23C 16/4405 118/715 |
| 6,270,862 B1 * | 8/2001 | McMillin | C23C 16/455 427/569 |
| 6,333,272 B1 * | 12/2001 | McMillin | C23F 4/00 438/710 |
| 6,372,291 B1 * | 4/2002 | Hua | C23C 16/345 257/E21.276 |
| 6,486,081 B1 * | 11/2002 | Ishikawa | C23C 16/401 438/787 |
| 6,503,368 B1 * | 1/2003 | Kholodenko | C23C 16/4581 118/500 |
| 6,626,185 B2 * | 9/2003 | Demos | C23C 16/4405 134/1.1 |
| 6,833,052 B2 * | 12/2004 | Li | C23C 16/401 118/715 |
| 6,896,737 B1 * | 5/2005 | Sandhu | C23C 16/045 118/715 |
| 7,303,141 B2 * | 12/2007 | Han | C23C 16/4558 118/715 |
| 7,323,231 B2 * | 1/2008 | Derderian | C23C 16/14 118/723 MW |
| 7,431,859 B2 * | 10/2008 | Bera | H01J 37/321 156/345.34 |
| 7,510,624 B2 * | 3/2009 | Liang | C23C 16/45563 118/715 |
| 7,540,971 B2 * | 6/2009 | Bera | H01J 37/321 156/345.34 |
| 7,651,587 B2 * | 1/2010 | Lu | H01J 37/321 118/715 |
| 7,722,719 B2 * | 5/2010 | Lei | H01J 37/32082 118/715 |
| 7,722,737 B2 * | 5/2010 | Gondhalekar | C23C 16/4558 118/715 |
| 7,740,706 B2 * | 6/2010 | Park | C23C 16/4405 118/715 |
| 7,758,698 B2 * | 7/2010 | Bang | C23C 16/4405 118/715 |
| 7,799,704 B2 * | 9/2010 | Park | C23C 16/4401 257/E21.24 |
| 7,806,078 B2 * | 10/2010 | Yoshida | C23C 16/455 118/723 I |
| 7,976,671 B2 * | 7/2011 | Chandrachood | H01J 37/32082 118/715 |
| 8,017,029 B2 * | 9/2011 | Chandrachood | H01J 37/32935 216/59 |
| 8,025,731 B2 * | 9/2011 | Ni | H01J 37/3244 118/715 |
| 8,043,432 B2 * | 10/2011 | Dip | C23C 16/45508 118/719 |
| 8,187,415 B2 * | 5/2012 | Kim | H01J 37/3244 118/723 VE |
| 8,187,484 B2 * | 5/2012 | Hill | H01J 37/3244 216/67 |
| 8,236,133 B2 * | 8/2012 | Katz | H01J 37/3244 118/715 |
| 8,318,035 B2 * | 11/2012 | Kiehlbauch | C03C 15/00 118/715 |
| 8,397,668 B2 * | 3/2013 | Kobayashi | H01J 37/32082 118/715 |
| 8,430,962 B2 * | 4/2013 | Masuda | C23C 16/45561 118/663 |
| 8,512,509 B2 * | 8/2013 | Bera | H01J 37/321 118/715 |
| 8,778,079 B2 * | 7/2014 | Begarney | C23C 16/45508 118/715 |
| 8,889,023 B2 * | 11/2014 | Matsumoto | H01J 37/32192 216/69 |
| 8,906,249 B2 * | 12/2014 | Hiroshima | C23C 16/45574 216/68 |
| 9,076,634 B2 * | 7/2015 | Brown | H01J 37/321 |
| 9,082,592 B2 * | 7/2015 | Saito | H01J 37/321 |
| 9,175,394 B2 * | 11/2015 | Yudovsky | C23C 16/45504 |
| 9,218,944 B2 * | 12/2015 | Chandrachood | H01J 37/32935 |
| 9,245,717 B2 * | 1/2016 | Kang | H01J 37/321 |
| 9,441,791 B2 * | 9/2016 | Mizusawa | G05D 11/132 |
| 9,466,506 B2 * | 10/2016 | Masuda | H01J 37/3244 |
| 9,732,909 B2 * | 8/2017 | Hayasaka | F17D 1/02 |
| 9,767,993 B2 * | 9/2017 | Ishibashi | H01J 37/32201 |
| 2002/0146512 A1 * | 10/2002 | Rossman | C23C 16/4404 427/255.28 |
| 2003/0192645 A1 * | 10/2003 | Liu | C23C 16/455 156/345.33 |
| 2004/0099378 A1 * | 5/2004 | Kim | C23C 16/4558 156/345.33 |
| 2004/0112538 A1 * | 6/2004 | Larson | H01L 21/67017 156/345.33 |
| 2004/0163764 A1 | 8/2004 | Collins et al. | |
| 2006/0042754 A1 | 3/2006 | Yoshida et al. | |
| 2006/0130756 A1 * | 6/2006 | Liang | C23C 16/45563 118/715 |
| 2007/0145021 A1 * | 6/2007 | Wang | H01J 37/3244 219/121.43 |
| 2007/0151668 A1 * | 7/2007 | Mizusawa | C23C 16/45557 156/345.29 |
| 2007/0158025 A1 * | 7/2007 | Larson | C23C 16/45561 156/345.26 |
| 2007/0181255 A1 * | 8/2007 | Hayasaka | C23C 16/455 156/345.33 |
| 2007/0251642 A1 * | 11/2007 | Bera | H01J 37/32082 156/345.26 |
| 2008/0099432 A1 * | 5/2008 | Lewington | G03F 1/80 216/44 |
| 2008/0099434 A1 * | 5/2008 | Chandrachood | G03F 1/80 216/60 |
| 2008/0099437 A1 * | 5/2008 | Lewington | H01J 37/32935 216/67 |
| 2008/0099450 A1 * | 5/2008 | Lewington | H01J 37/32091 219/121.58 |
| 2008/0100222 A1 * | 5/2008 | Lewington | H01J 37/3255 315/111.21 |

(56) References Cited

U.S. PATENT DOCUMENTS

| | | | |
|---|---|---|---|
| 2008/0100223 A1* | 5/2008 | Lewington | H01J 37/32009 315/111.21 |
| 2008/0102202 A1* | 5/2008 | Chandrachood | H01J 37/32082 427/248.1 |
| 2009/0156013 A1 | 6/2009 | Yousif et al. | |
| 2011/0006038 A1* | 1/2011 | Kutney | H01J 37/3244 216/58 |
| 2011/0162800 A1 | 7/2011 | Noorbakhsh et al. | |
| 2011/0223334 A1* | 9/2011 | Yudovsky | C23C 16/45504 427/255.23 |
| 2011/0277847 A1 | 11/2011 | Sawusch | |
| 2014/0262034 A1* | 9/2014 | Ishibashi | C23C 16/45563 156/345.29 |
| 2015/0140822 A1* | 5/2015 | Yoshimura | H01L 21/0273 438/694 |
| 2015/0155139 A1* | 6/2015 | Yoshikawa | H01J 37/3222 156/345.41 |
| 2015/0228457 A1* | 8/2015 | Yamashita | H01L 21/3065 216/67 |
| 2015/0255305 A1* | 9/2015 | Nakagawa | H01J 37/32027 438/714 |
| 2015/0279621 A1 | 10/2015 | Brown et al. | |
| 2015/0371826 A1* | 12/2015 | Rozenzon | H01J 37/32082 156/345.33 |
| 2015/0371831 A1* | 12/2015 | Rozenzon | H01J 37/32449 239/548 |
| 2016/0035541 A1* | 2/2016 | Kozuka | H01J 37/32091 156/345.33 |
| 2016/0042917 A1 | 2/2016 | Chandrachood et al. | |
| 2016/0111258 A1* | 4/2016 | Taskar | H01J 37/32449 156/345.24 |
| 2017/0062227 A1* | 3/2017 | Ishikawa | H01L 21/3065 |
| 2017/0114461 A1* | 4/2017 | Takahashi | C23C 16/45544 |
| 2017/0253971 A1* | 9/2017 | Kawamorita | C23C 16/45561 |

OTHER PUBLICATIONS

Japanese Office Action in Japanese Application No. 2016-500194, dated Sep. 19, 2017, 10 pp. (English Translation).

\* cited by examiner

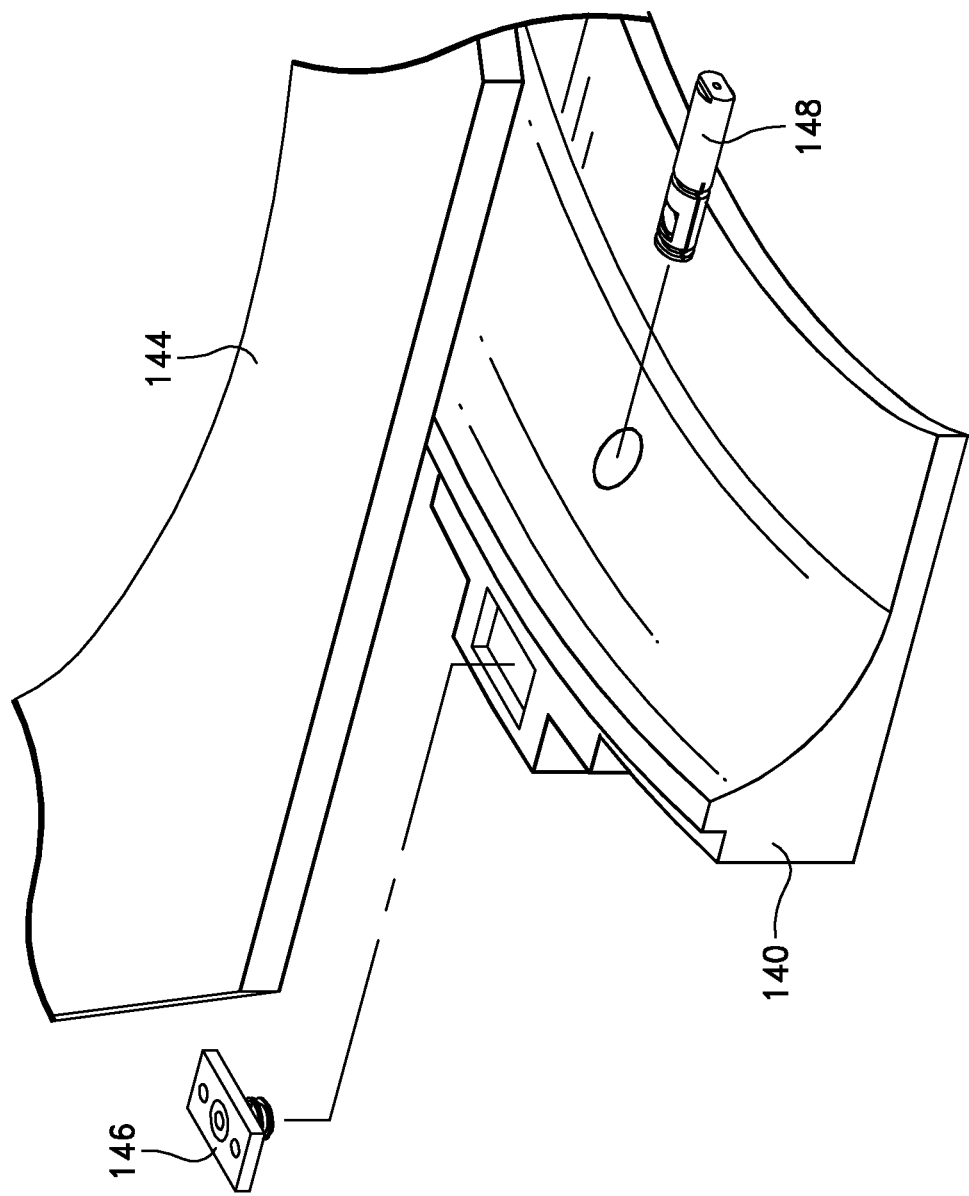

MULTI-ZONE GAS INJECTION ASSEMBLY WITH AZIMUTHAL AND RADIAL DISTRIBUTION CONTROL

BACKGROUND

Technical Field

The disclosure is related to process gas distribution in a plasma reactor for processing a workpiece such as a semiconductor wafer.

Background Discussion

Control of process gas distribution in the chamber of a plasma reactor affects process control of etch rate distribution or deposition rate distribution on a workpiece during plasma processing. Gas injection nozzles can be located at the center and periphery of the chamber. It is desirable to control gas injection at both the chamber center and at the periphery. One problem is that systems that control radial distribution of process gas flow rate generally do not control azimuthal distribution of process gas flow rate. As employed in this specification, the term "azimuthal" refers to the circumferential direction in a cylindrical processing chamber. Another problem is that systems that control azimuthal distribution of gas flow rate using gas injectors near the side wall suffer from pressure drops along the azimuthal direction.

A related problem is how to feed process gas to different zones of gas injectors in such a manner as to avoid asymmetries in gas distribution while at the same time providing full control of both radial and azimuthal gas distributions.

Another problem is how to provide a gas distribution system that solves all of the foregoing problems in a structure affording rapid disassembly and re-assembly with close-fitting tolerances without damage.

The formation of gas distribution passages in one layer has generally limited the location of the gas injectors of the chamber to that one layer, which is typically flat and has no particular effect upon gas flow within the chamber.

SUMMARY

A plasma reactor having a chamber interior, a workpiece support and a tunable gas nozzle, includes (a) a side gas plenum, (b) a plurality of N gas inlets coupled to said side gas plenum, (c) plural side gas outlets extending radially inwardly from said plenum, (d) an N-way gas flow ratio controller having N outputs coupled to said N gas inlets respectively, and (e) an M-way gas flow ratio controller having M outputs, respective ones of said M outputs coupled to said tunable gas nozzle and a gas input of said N-way gas flow ratio controller.

In one embodiment, the tunable gas nozzle has two gas inputs, and N is four and M is three. The reactor may further include a gas supply panel coupled to a gas input of the three-way gas flow controller. In one embodiment, a process controller is coupled to the M-way gas flow ratio controller and to the N-way gas flow ratio controller, and a user interface is coupled to the process controller.

In one embodiment, the side gas plenum includes plural sets of gas flow channels, and each one of the sets of gas flow channels includes: (a) an arcuate gas distribution channel having a pair of ends coupled to a corresponding pair of the plural side gas outlets, and (b) an arcuate gas supply channel, one end of the arcuate gas supply channel connected to a corresponding one of the plurality of N gas inlets, and an opposite end of the arcuate gas supply channel coupled to the gas distribution channel proximate a middle point of the gas distribution channel.

In a related embodiment, the plural sets of gas flow channels are of equal path lengths between respective gas inlet and a respective side gas outlet.

In one embodiment, the cylindrical side wall includes a liner edge, the plasma reactor further including: (a) a gas delivery ring over the liner edge, the plural sets of gas flow channels being formed in the gas delivery ring, and (b) a top liner ring over the gas delivery ring, the plural side gas outlets extending into the top liner ring, the top liner ring including a top liner ring surface facing the chamber interior.

In a related embodiment, each of the plural side gas outlets includes: (a) a side gas injection nozzle extending radially in the top liner ring toward the chamber interior and including an axially extending gas delivery insert-receiving hole, and (b) a gas delivery insert extending from the gas delivery ring into the axially extending gas delivery insert-receiving hole.

The plasma reactor may further include an axial internal gas flow passage in the gas delivery insert and a radial internal gas flow nozzle passage through a side wall of the axially extending gas delivery insert hole, the axial internal gas flow passage being in registration with the radial internal gas flow nozzle passage.

In one embodiment, the top liner ring includes plural nozzle pockets in the top liner ring surface, the side gas injection nozzle extending into a corresponding one of the nozzle pockets. Moreover, the side gas injection nozzle includes plural O-ring nozzle grooves concentric with the side gas injection nozzle, the plasma reactor further including first plural O-rings in the plural O-ring nozzle grooves compressed against an interior side wall of a corresponding one of the nozzle pockets.

In one embodiment, the side gas injection nozzle further includes: (a) a cylindrical outer nozzle surface, wherein the O-ring nozzle grooves define nozzle groove surfaces indented with respect to the cylindrical outer nozzle surface, and (b) an axial evacuation slot including slot sections in the cylindrical outer nozzle surface beginning at an end of the side gas injection nozzle inside the nozzle pocket, and slot sections in the nozzle groove surfaces.

In further embodiment, there is a gap between the cylindrical outer nozzle surface and the interior side wall of a corresponding one of the nozzle pockets, the slot sections in the nozzle groove surfaces providing an evacuation path around the first plural O-rings, the slot sections in the cylindrical outer nozzle surface providing an evacuation path to the gap.

In one embodiment, the top liner ring further includes plural gas delivery insert pockets facing the gas delivery ring, a portion of the gas delivery insert extending into a corresponding one of the gas delivery insert pockets. In the same embodiment, the gas delivery insert includes plural O-ring insert grooves concentric with the gas delivery insert, the plasma reactor further including second plural O-rings in the plural O-ring insert grooves compressed against an interior side wall of a corresponding one of the plural gas delivery insert pockets.

In one embodiment, each of the plural gas outlets further includes an axial port in the gas delivery ring extending to the axial internal gas flow passage of the gas delivery insert.

In an embodiment, the side gas injection nozzle includes a ceramic material, and the gas delivery ring and the gas delivery insert include steel, and the top liner surface and the cylindrical side wall includes a protective layer including an anodized material or Yttria.

In a further aspect, a side gas injection kit is provided, including: a top liner ring including plural nozzle pockets, plural side gas injection nozzles extending into the nozzle pockets, each of the plural side gas injection nozzles including: (a) an outer nozzle surface and plural O-ring nozzle grooves in the outer nozzle surface and concentric with the side gas injection nozzle, and (b) first plural O-rings in the plural O-ring nozzle grooves compressed against an interior side wall of a corresponding one of the nozzle pockets.

In one embodiment, the side gas injection nozzle further includes: (a) nozzle groove surfaces indented with respect to the outer nozzle surface and formed in the O-ring nozzle grooves, and (b) an axial evacuation slot including slot sections in the cylindrical outer nozzle surface beginning at an end of the side gas injection nozzle inside the nozzle pocket, and slot sections in the nozzle groove surfaces.

In a related embodiment, the side gas injection kit further includes a gap between the cylindrical outer nozzle surface and an interior side wall of a corresponding one of the nozzle pockets, the slot sections in the nozzle groove surfaces providing an evacuation path around the first plural O-rings, the slot sections in the cylindrical outer nozzle surface providing an evacuation path to the gap.

In a further related embodiment, the side gas injection kit further comprises: (a) plural gas delivery insert pockets in the top liner ring, (b) plural gas delivery inserts extending into the gas delivery insert pockets, and (c) each of the gas delivery inserts including plural O-ring insert grooves concentric with the gas delivery insert, and second plural O-rings in the plural O-ring insert grooves compressed against an interior side wall of a corresponding one of the plural gas delivery insert pockets.

BRIEF DESCRIPTION OF THE DRAWINGS

So that the manner in which the exemplary embodiments of the present invention are attained can be understood in detail, a more detailed description of the invention, briefly summarized above, may be obtained by reference to the embodiments thereof which are illustrated in the appended drawings. It is to be appreciated that certain well known processes are not discussed herein in order to not obscure the invention.

FIG. 22 is an enlarged view of a portion of FIG. 21.

Figure 1:
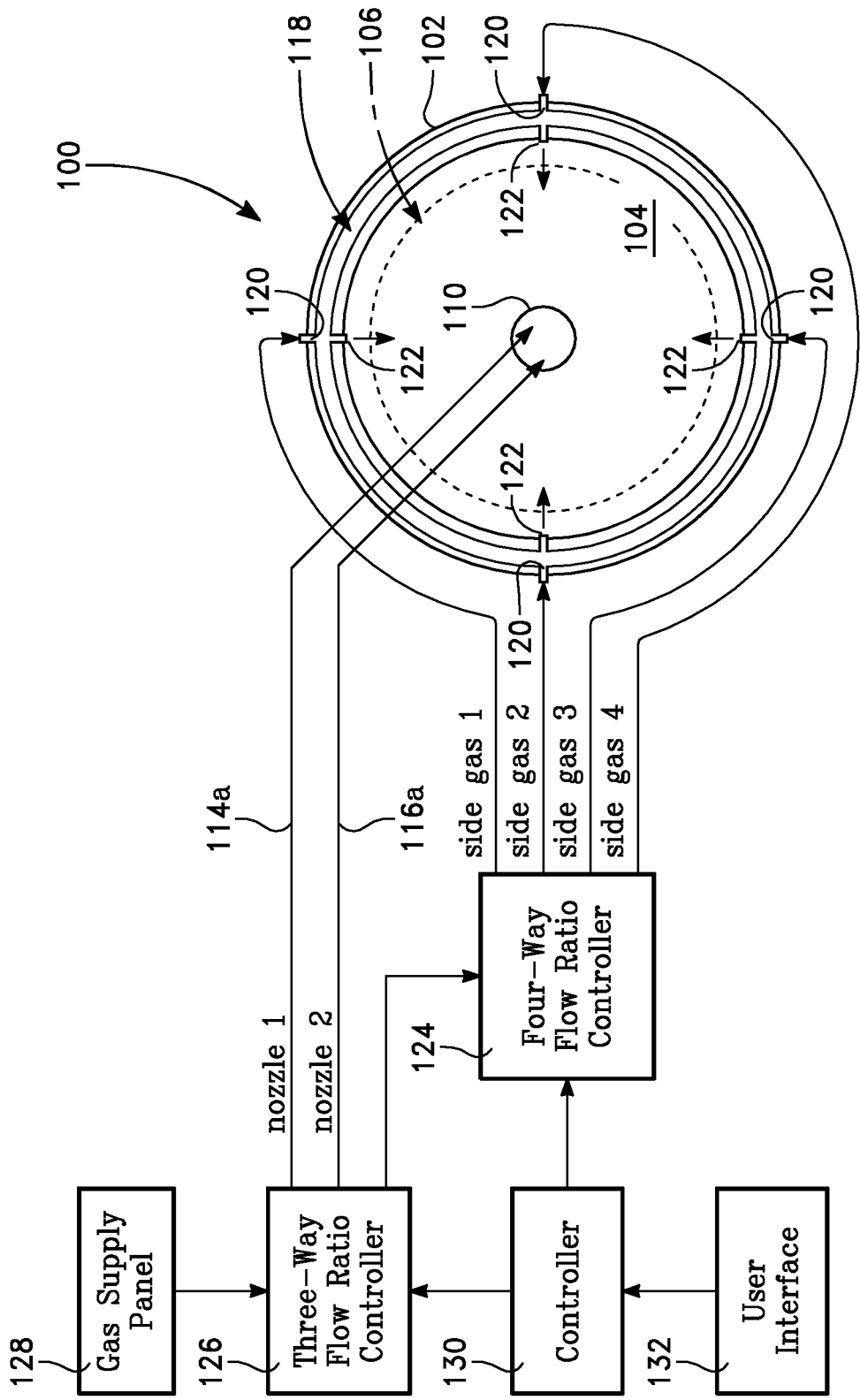
FIG. 1 is a simplified block diagram of one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 2:
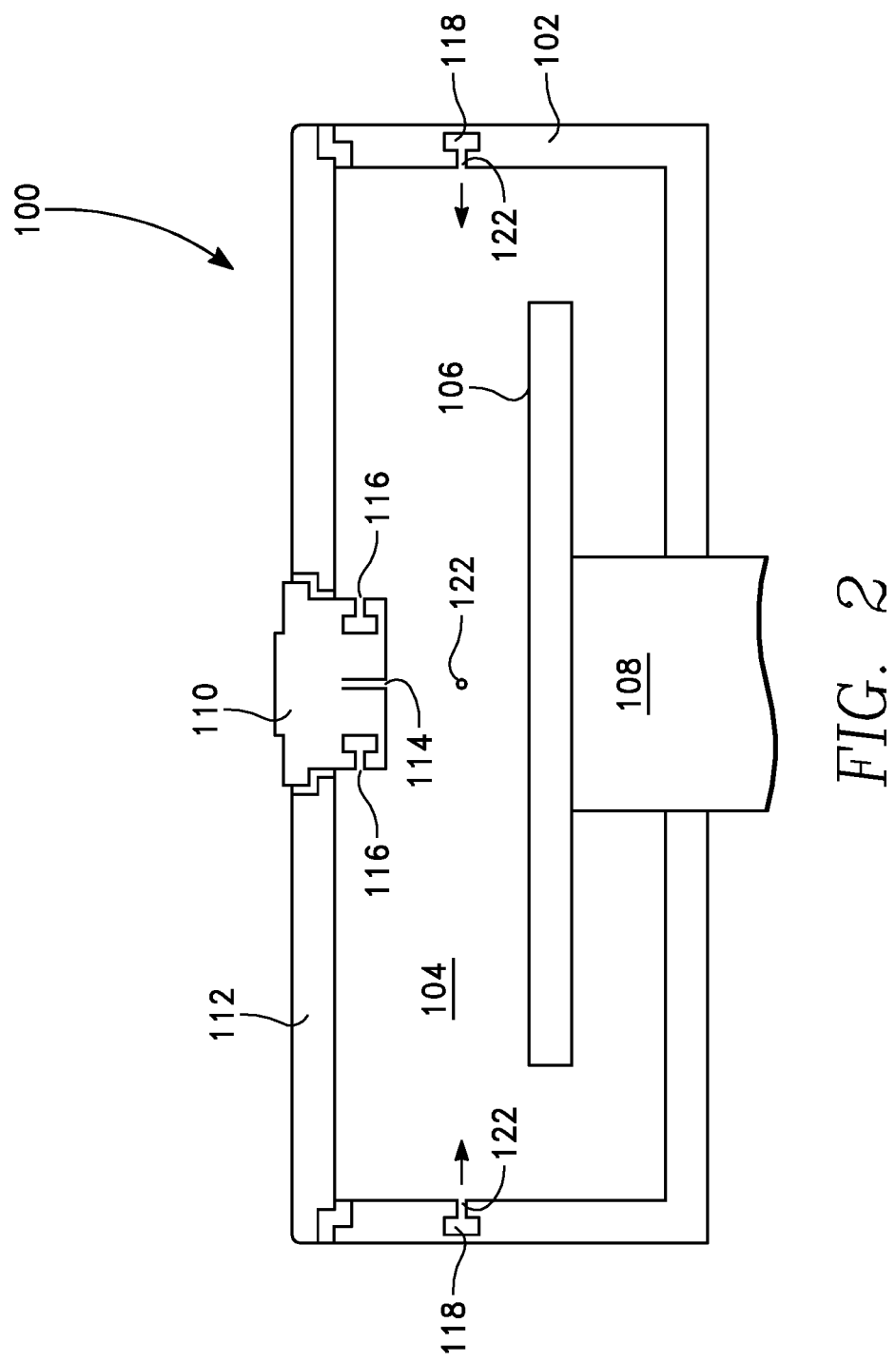
FIG. 2 is an elevational view corresponding to FIG. 1.

FIG. 1 is a simplified block diagram of one embodiment. A plasma reactor chamber 100, depicted in elevational view in FIG. 2, is enclosed by a cylindrical side wall 102 defining a chamber volume 104. A workpiece support pedestal 106 is inside the chamber volume and rests on a pedestal lift mechanism 108 shown in FIG. 2. As depicted in FIG. 2, a tunable gas nozzle 110 is mounted on a ceiling 112 of the chamber 100, and has a center gas nozzle 114 and a side gas nozzle 116 that inject gas toward the center and side, respectively, of the chamber 100. The center and side gas nozzles 114, 116 are independently fed by gas supply lines 114*a*, 116*a* which are labeled "nozzle 1" and "nozzle 2", respectively, in FIG. 1. A circular side gas injection plenum 118 receives process gas at four gas inlets 120 and injects process gas into the chamber at plural gas outlets 122. As shown in FIG. 1, the four gas inlets 120 are connected respectively to four supply lines labeled "side gas 1", "side gas 2", "side gas 3" and "side gas 4" in FIG. 1, which are fed by four outputs of a four-way gas flow ratio controller 124. The input of the four-way gas flow ratio controller 124 and the gas supply lines 114*a* and 116*a* receive process gas from respective outputs of a three-way gas flow ratio controller 126. A gas supply panel 128 furnishes process gas to the input of the three-way gas flow ratio controller 126. A controller 130 having a user interface 132 governs the gas flow ratio controllers 124 and 126.

The gas injection pattern in the chamber 100 has three concentric zones including a center zone governed by the center gas nozzle 114, an inner zone governed by the side gas nozzle 116 and a peripheral zone governed by the gas outlets 122. The user may adjust the gas flow ratios among the three concentric zones by controlling the three-way gas flow ratio controller 126. In addition, the user may govern azimuthal (circumferential) gas distribution by controlling the four-way gas flow ratio controller 124. An advantage is that the gas flow ratio controllers 124 and 126 provide simultaneous independent control of both radial distribution of gas flow and azimuthal distribution of gas flow. A further advantage is that the gas outlets 122 at the chamber periphery are fed in parallel, and the pressure losses are uniformly distributed in the azimuthal direction.

Figure 3:
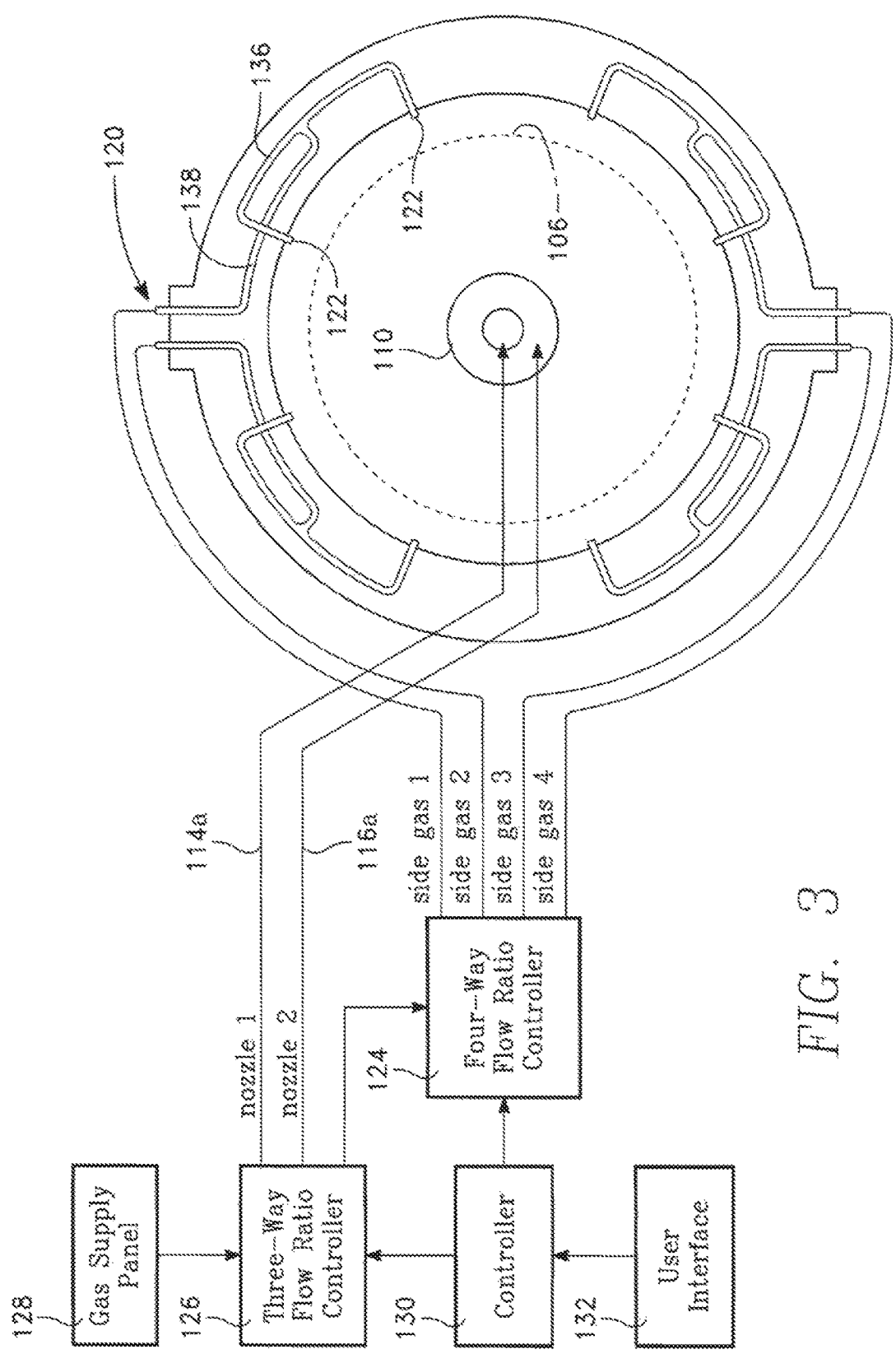
FIG. 3 depicts an embodiment having eight gas outlets.

FIG. 3 depicts an embodiment in which there are eight gas outlets 122. Any other suitable number of gas outlets may be employed in other embodiments. In the embodiment of FIG. 3, the plenum 118 of FIG. 1 is embodied in four pairs of recursive gas flow channels, each pair including an arcuate gas distribution channel 136 and an arcuate gas supply channel 138. The four pairs of recursive gas flow channels 136, 138 provide parallel paths between the gas inlets 120 and the gas outlets 122. Each pair of the eight gas outlets 122 of FIG. 3 is fed from a corresponding gas inlet 120 via a corresponding pair of the recursive gas flow channels 136, 138. Each gas distribution channel 136 has a pair of ends connected to the corresponding pair of gas outlets 122, and is fed at its center by one end of the corresponding arcuate gas supply channel 138, the other end of the gas supply channel 138 connected to the corresponding gas inlet 120.

Figure 4:
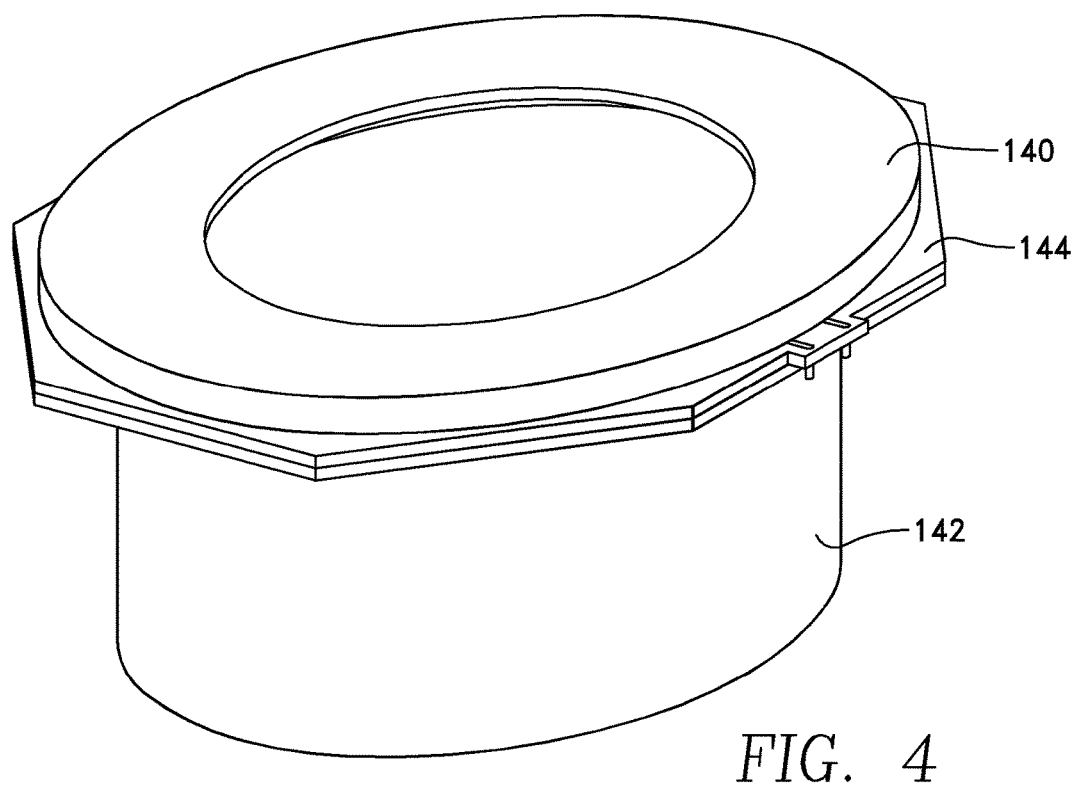
FIG. 4 depicts a side gas delivery kit for the embodiment of FIG. 3.
Figure 5:
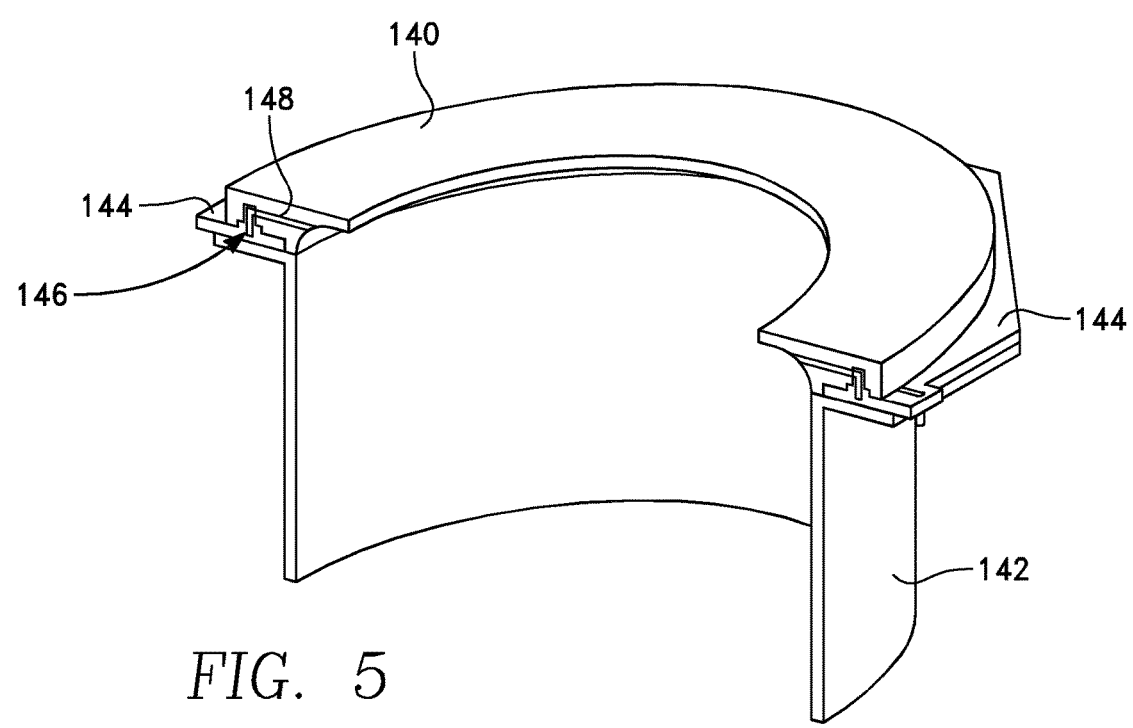
FIG. 5 is a cut-away cross-sectional view of the side gas delivery kit of FIG. 4.

FIG. 4 depicts a side gas delivery kit for the embodiment of FIG. 3, including a top liner ring 140, a bottom liner 142, and a gas delivery ring 144 between the top liner ring 140 and the bottom liner 142. The bottom liner 142 includes the side wall 102 of FIG. 3. The gas delivery ring 144 contains the recursive gas flow channels 136, 138 of FIG. 3, as will be described below in greater detail. FIG. 5 is a cut-away cross-sectional view of the side gas delivery kit of FIG. 4, showing a gas delivery insert 146 extending from the gas delivery ring 144 into the top liner ring 140, and further showing a injection nozzle 148 in the top liner ring 140.

Figure 6:
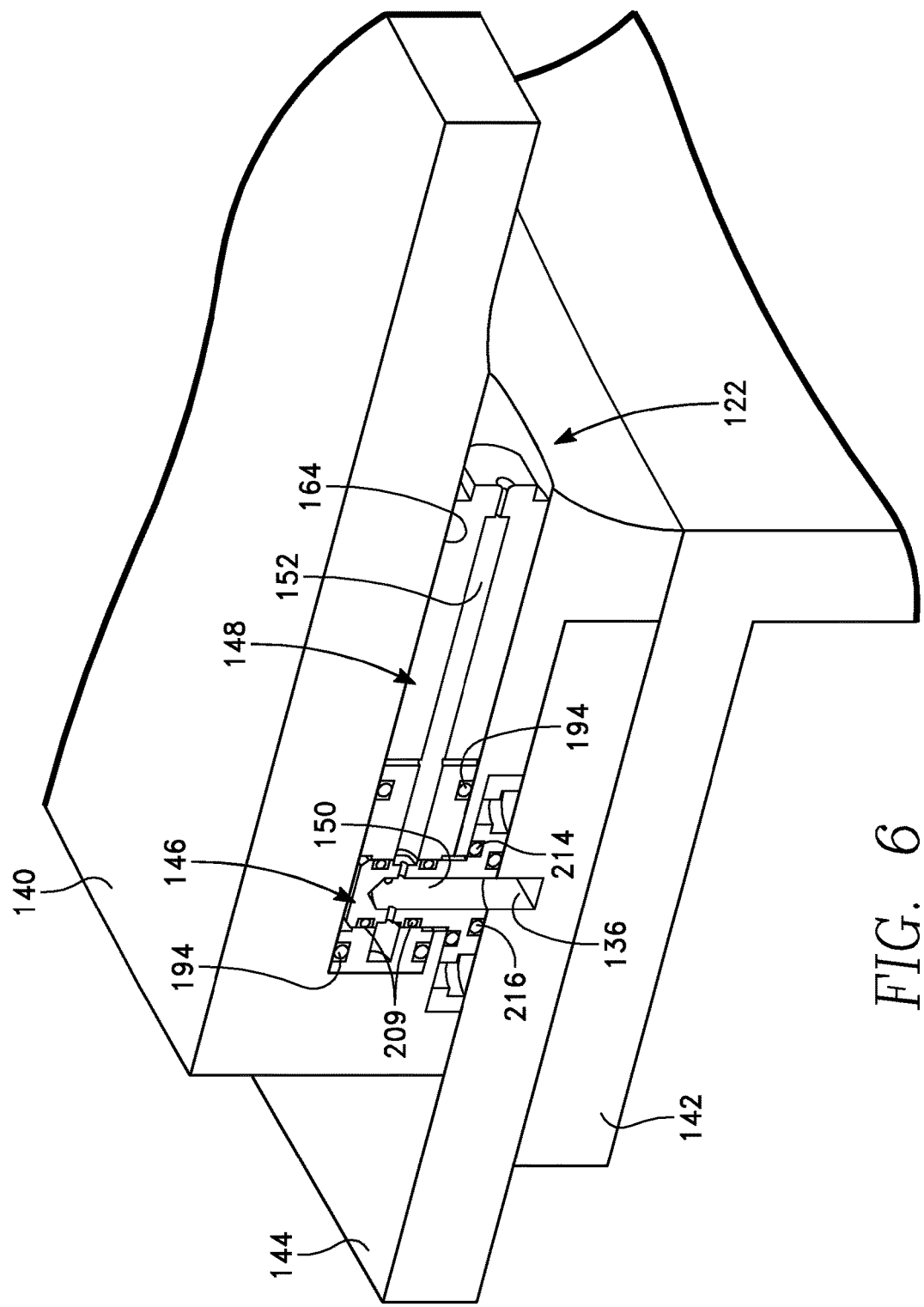
FIG. 6 is an enlarged view of a portion of FIG. 5.

FIG. 6 is an enlarged view of a portion of FIG. 5, showing in greater detail the gas delivery insert 146 and the injection nozzle 148. The gas delivery insert 146 is supported on the gas delivery ring 144. The gas delivery insert 146 has an internal axial insert gas flow passage 150 coupled to one end of a corresponding gas distribution channel 136, as will be described in greater detail below. The top of the gas delivery insert 146 is received inside the injection nozzle 148 near a radially outer end of the injection nozzle 148. The injection nozzle 148 has an internal radial nozzle gas flow passage 152 in communication with the internal axial insert gas flow passage 150. The radially inner end of the injection nozzle 148 is open to the interior of the chamber 100. Each gas outlet 122 in the embodiment of FIG. 3 is implemented by a corresponding injection nozzle 148 and a corresponding gas delivery insert 146 of FIG. 6.

Figure 7:
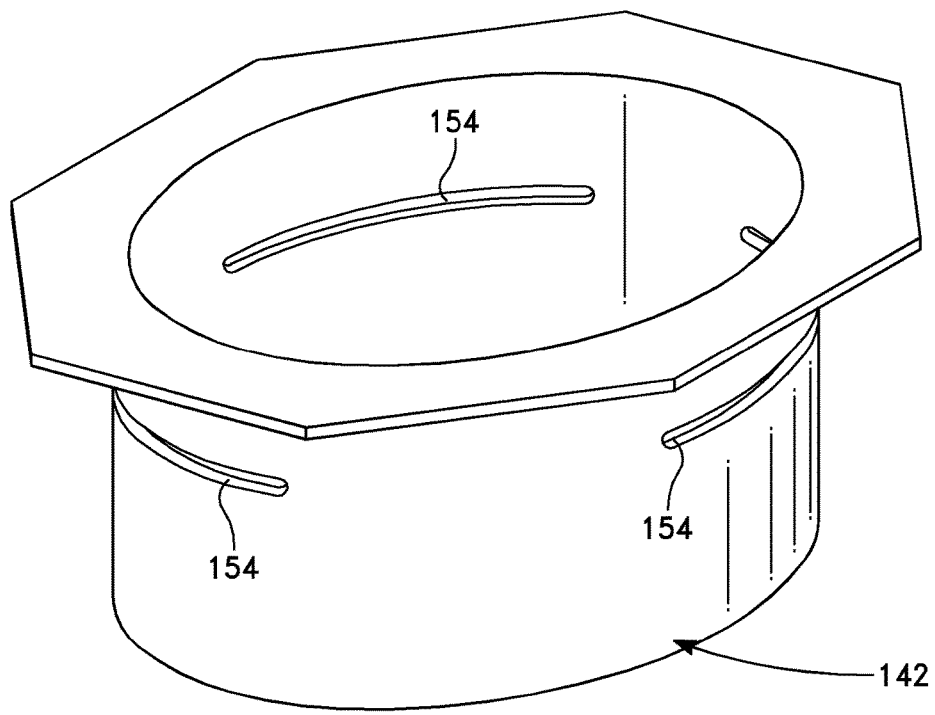
FIG. 7 depicts the bottom liner.
Figure 8:
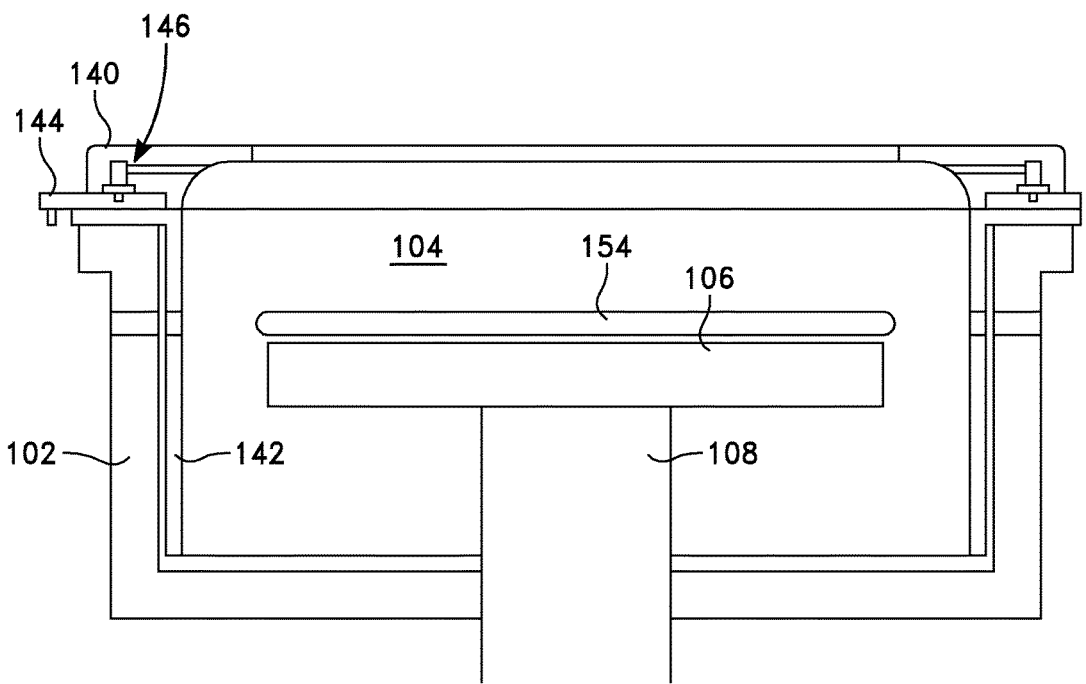
FIG. 8 illustrates the workpiece support pedestal enclosed by the bottom liner.

FIG. 7 depicts the bottom liner 142. FIG. 8 shows how the workpiece support pedestal is enclosed by the bottom liner 142. The bottom liner 142 has three symmetrically disposed slit openings 154 for wafer transfer.

Figure 9:
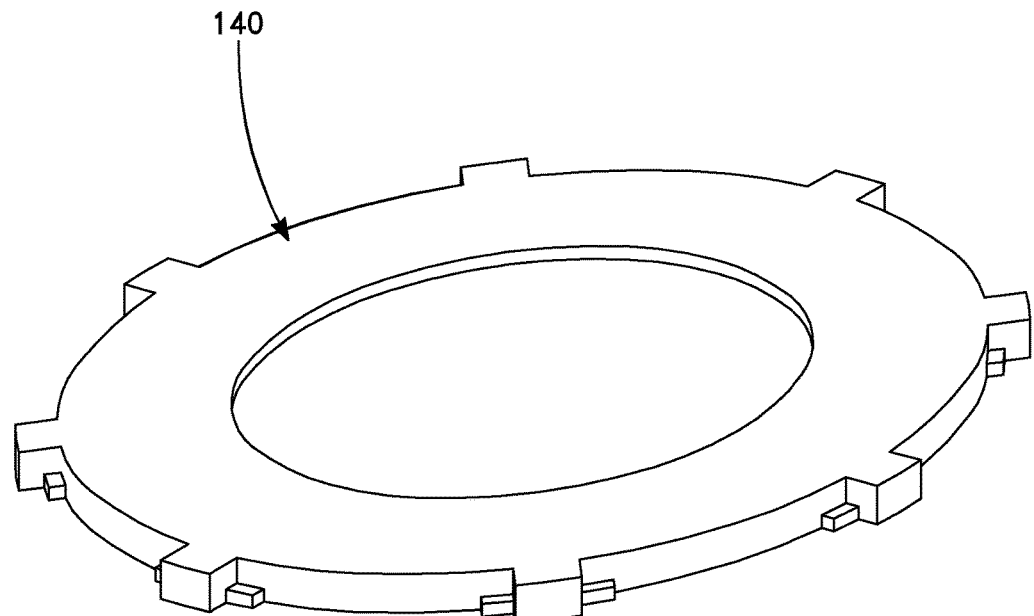
FIG. 9 depicts a view of the top liner ring from the top.
Figure 10:
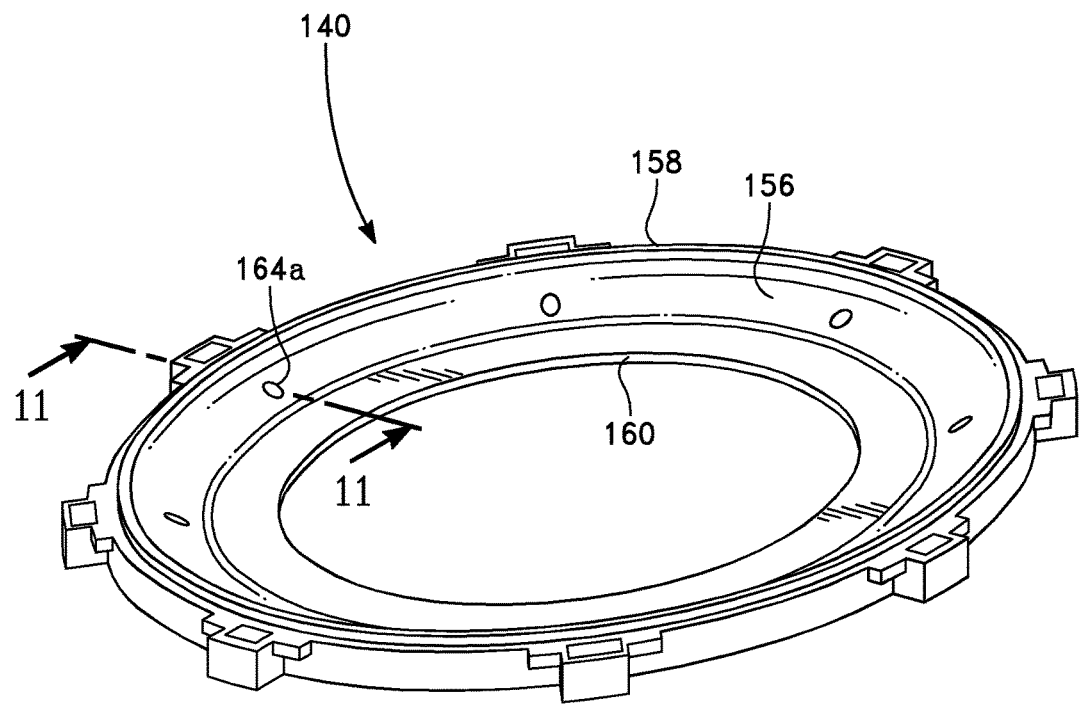
FIG. 10 depicts a view of the top liner ring from the bottom.

FIG. 9 depicts a view of the top liner ring 140 from the top, while FIG. 10 depicts a view of the top liner ring 140 from the bottom. The top liner ring 140 has an annular bottom surface 156 from which the injection nozzles 148 open into the chamber 100. The annular bottom surface 156 is concave and provides a transition between the radius of a ridge 158 conforming to the bottom liner 142 and an inner radius of an opening 160 at the top of the top liner ring 140. The curvature of the annular bottom surface 156 can promote gas flow from each injection nozzle 148 toward the workpiece.

Figure 11:
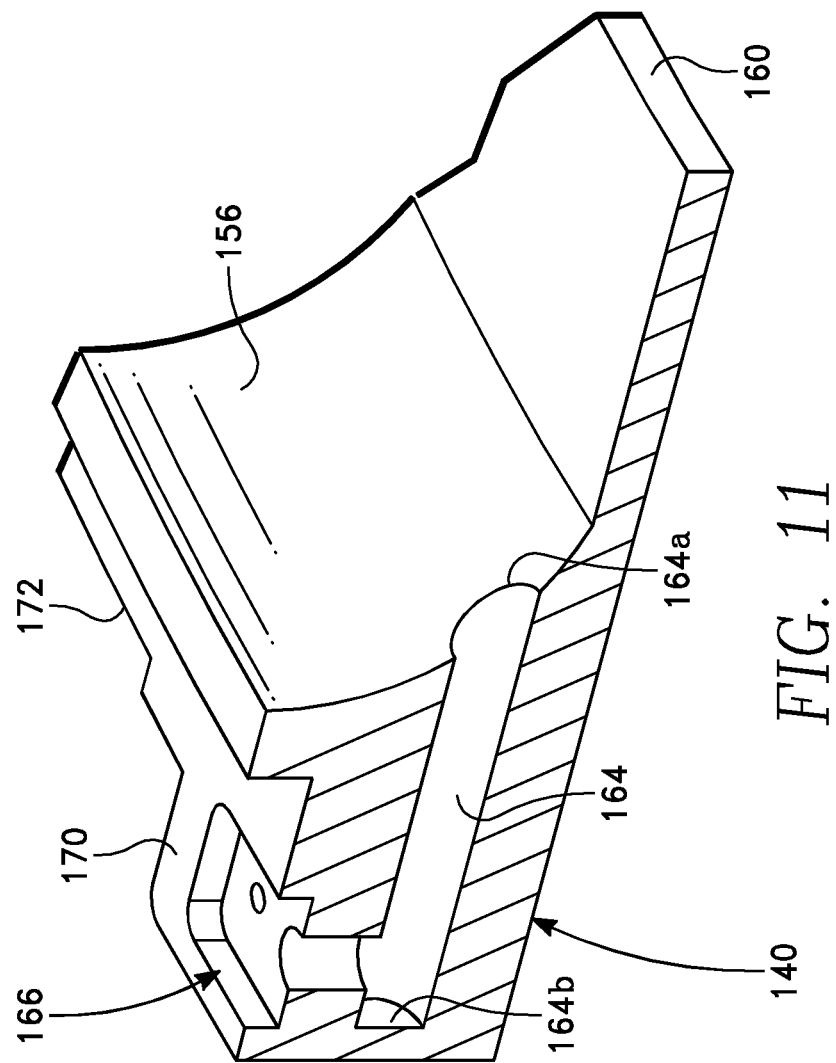
FIG. 11 is an enlarged view of a portion of FIG. 10.

FIG. 11 is an enlarged view of a portion of FIG. 10, showing one of eight hollow nozzle pockets 164 formed in the top liner ring 140 and one of eight hollow gas delivery insert pockets 166 formed in the top liner ring 140. The injection nozzle 148 shown in FIG. 6 is held inside the nozzle pocket 164, as will be described below. A portion of the gas delivery insert 146 shown in FIG. 6 is held inside the gas delivery insert pocket 166, as will be described below. As shown in FIG. 11, the nozzle pocket 164 is cylindrically shaped, extends in a radial direction and forms an opening 164a in the annular bottom surface 156. The gas delivery insert pocket 166 is formed in a shelf 170 extending outwardly from a circumferential periphery 172 of the top liner ring 140.

Figures 12, 14:
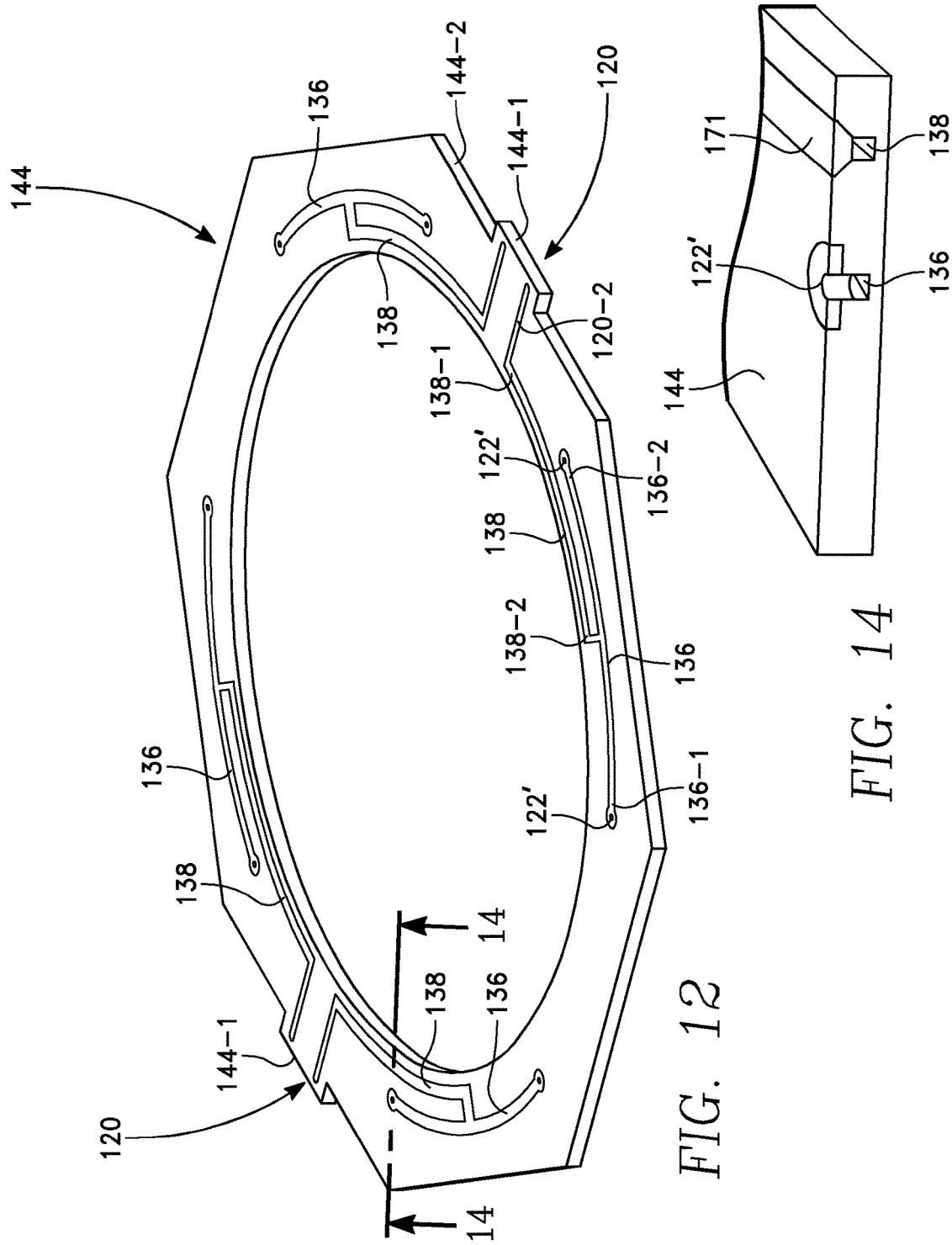
FIGS. 12 and 13 are top and bottom views, respectively, of the gas delivery ring.
FIG. 14 is an enlarged cross-sectional view taken along lines 14-14 of FIG. 12.
Figure 13:
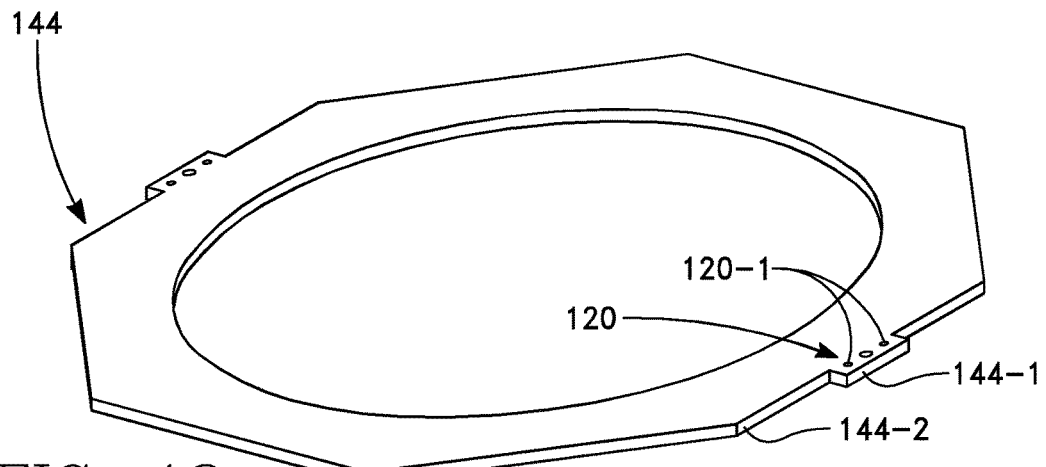

FIGS. 12 and 13 are top and bottom views, respectively, of the gas delivery ring 144. FIG. 12 shows the formation of the four gas distribution channels 136 and the four gas supply channels 138 in the gas delivery ring 144. Each gas supply channel 138 receives gas from the corresponding gas inlet 120. Each gas inlet 120 (FIG. 3) includes an axial port 120-1 (FIG. 13) formed in a tab 144-1 extending from a periphery 144-2 of the gas delivery ring 144. The axial port 120-1 opens through a bottom surface of the tab 144-1. A radially extending gas inlet channel 120-2 (FIG. 12) is coupled between the axial port 120-1 and one end 138-1 of the gas supply channel 138. An opposite end 138-2 of the gas supply channel 138 is coupled to the middle of the gas distribution channel 136. Each end 136-1 and 136-2 of the gas distribution channel 136 terminates at an axial gas outlet 122'. The axial gas outlet 122' is coupled to the bottom of the internal axial insert gas flow passage 150 of a gas delivery insert 146, as shown in FIG. 6. In this manner, the four gas distribution channels 136 feed eight gas delivery inserts 146. In the illustrated embodiment, there are two axial gas ports 120-1 in each tab 144-1 feeding respective sets of the gas flow channels 136, 138. In the illustrated embodiment, the gas distribution channels 136 and the gas supply channels 138 follow arcuate paths that are concentric with the cylindrical side wall 102. The gas distribution channels 136, the gas supply channels 138 and the radial gas inlet channel 120-2 provide respective paths between the gas inlets 120 and the gas outlets 122 that are of equal length. An advantage of the equal path lengths is a reduction in non-uniformity in gas flow resistance among the various paths, affording better process control.

FIG. 14 is an enlarged cross-sectional view taken along lines 14-14 of FIG. 12, and shows one of the gas distribution channels 136 formed in the gas delivery ring 144 and covered by a gas channel cover 171. FIG. 14 further shows the intersection between one end of the gas distribution channel 136 and the gas outlet 122'.

Figure 15:
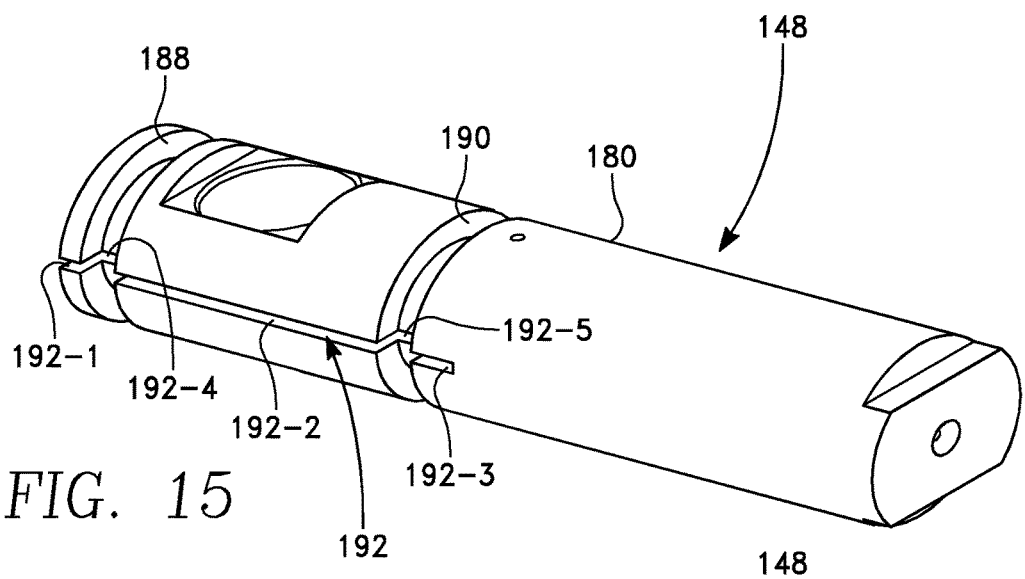
FIG. 15 is an enlarged view of the injection nozzle of FIG. 6.
Figure 16:
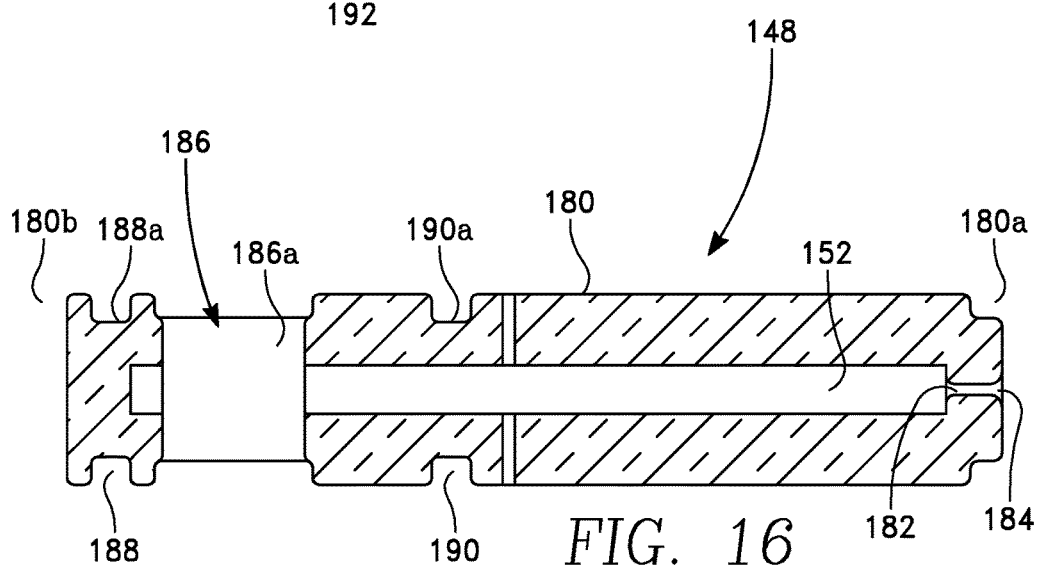
FIG. 16 is a cross-sectional view corresponding to FIG. 15.

The injection nozzle 148 of FIG. 6 is depicted in detail in FIG. 15 and in cross-section in FIG. 16. The injection nozzle 148 has a cylindrical body 180 through which the internal radial nozzle gas flow passage 152 extends to a gas injection passage 182 forming an orifice 184 at the radially inner end 180a of the cylindrical body 180. An axially extending gas delivery insert hole 186 is formed through the cylindrical body 180 near its radially outer end 180b. The gas delivery insert 146 is received in the gas delivery insert hole 186. A first O-ring groove 188 concentric with the cylindrical body 180 is formed near the radially outer end 180b of the cylindrical body 180 and defines a first O-ring groove inner surface 188a. A second O-ring groove 190 concentric with the cylindrical body 180 is formed in the cylindrical body 180 between the first O-ring groove 188 and the radially inner end 180a, and defines a second O-ring groove inner surface 190a. An axial evacuation slot 192 is formed in the surface of the cylindrical body 180, and includes a first slot section 192-1 between the radial outer end 180b and the first O-ring groove 188, a second slot section 192-2 between the first and second O-ring grooves 188 and 190, and a third slot section 192-3 extending for a short distance from the second O-ring groove 190 toward the radially inner end 180a. The axial slot 192 further includes a first groove axial slot section 192-4 in the first O-ring groove inner surface 188a and a second groove axial slot section 192-5 in the second O-ring groove inner surface 190b. As shown in FIG. 6, O-rings 194 are inserted into the first and second O-ring grooves 188 and 190. There is a small nozzle-to-pocket clearance or gap between the cylindrical body 180 and the interior surface of the nozzle pocket 164. The axial slot 192 enables the evacuation through the nozzle-to-pocket gap of gas trapped between the radial outer end 180b of the injection nozzle 148 and the back wall 164b (FIG. 11) of the nozzle pocket 164. The axial slot 192 enables the evacuated air to bypass the O-rings 194.

Figure 17:
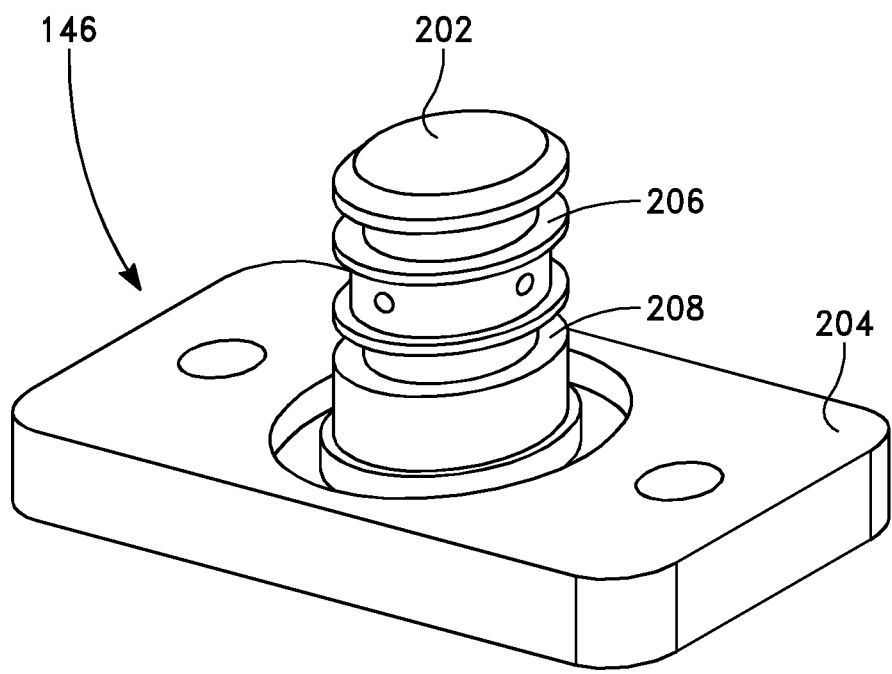
FIG. 17 is an enlarged view of the gas delivery insert of FIG. 6.
Figure 18:
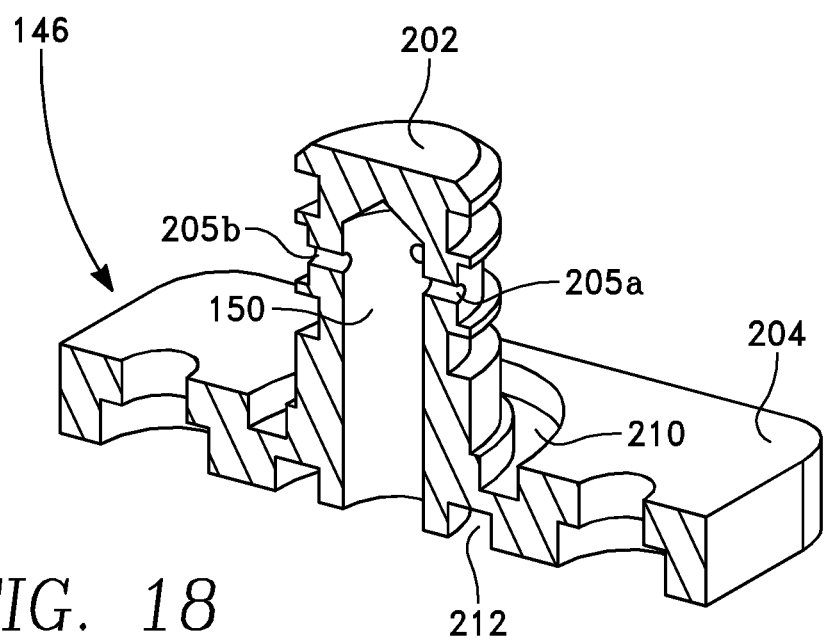
FIG. 18 is a cross-sectional view corresponding to FIG. 17.

FIG. 17 depicts the gas delivery insert 146 shown in FIG. 6. FIG. 18 is a cross-sectional view corresponding to FIG. 17. Referring to FIGS. 17 and 18, the gas delivery insert 146 includes a cylindrical insert post 202 supported on a generally flat insert base 204. The internal axial insert gas flow passage 150 shown in FIG. 6 extends through the cylindrical insert post 202. Gas outlets 205a and 205b through the cylindrical insert post 202 intersect the internal axial insert gas flow passage 150. In forming the assembly of FIG. 6, the cylindrical insert post 202 (FIG. 18) is inserted into the gas delivery insert hole 186 of the injection nozzle 148 of FIG. 16 until the gas outlets 205a and 205b are in registration with the internal radial nozzle gas flow passage 152 of FIG. 6.

The cylindrical insert post 202 has O-ring grooves 206, 208 concentric with the cylindrical insert post 202 in which O-rings 209 (FIG. 6) are received. Interior surface 186a of the gas inlet hole 186 (FIG. 16) is an O-ring sealing surface against which the O-ring 209 is pressed upon insertion of the insert post 202 into the gas inlet hole 186. An O-ring groove 210 (FIG. 18) is formed in the top surface of the insert base 204 around the bottom of the cylindrical insert post 202. An O-ring groove 212 (FIG. 18) is formed in the bottom surface of the insert base 204 concentric with the cylindrical insert post 202. An O-ring 216 (FIG. 6) is held in the O-ring groove 212 for fitting the gas delivery insert 146 against the top liner ring 140. An O-ring 214 (FIG. 6) is held in the O-ring groove 210 for fitting the insert base 204 onto the gas delivery ring 144.

Figure 19:
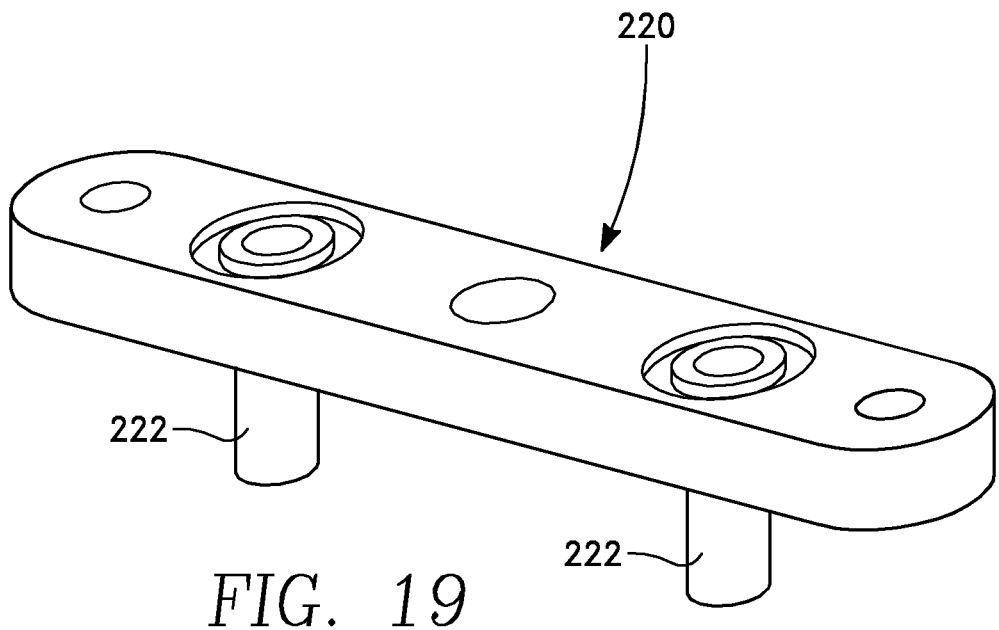
FIG. 19 depicts a gas delivery block employed in the embodiment of FIG. 4.
Figure 20:
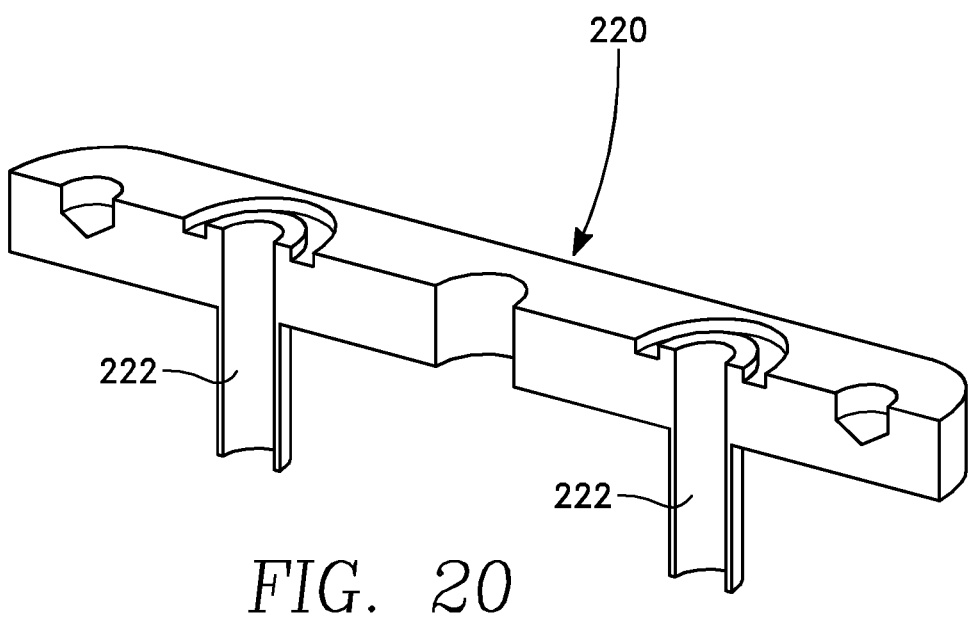
FIG. 20 is a cross-sectional view corresponding to FIG. 19.

The description of FIGS. 12 and 13 above refers to two tabs 144-1 of the gas delivery ring 144, each tab 144-1 supporting a pair of gas inlet ports 120-1 open at the bottom surface of the tab 144-1. FIGS. 19 and 20 depict a gas delivery block 220 for fastening to the bottom surface of a tab 144-1 and having a pair of gas inlet stems 222 that meet the pair of gas inlet ports 120-1 upon joining of the gas delivery block 220 to the tab 144-1. The illustrated pair of gas inlet stems 222 provide connection to two outputs of the four-way gas flow ratio controller 124.

Radial distribution of gas flow is adjusted by controlling the three-way gas flow ratio controller 126. Independently, azimuthal gas distribution is adjusted by controlling the four-way gas flow ratio controller 124. An advantage is that the gas flow ratio controllers 124 and 126 provide simultaneous independent control of both radial distribution of gas flow and azimuthal distribution of gas flow. A further advantage is that the gas outlets 122 at the chamber periphery are fed in parallel, and the pressure losses are uniformly distributed in the azimuthal direction. This latter feature simplifies control of azimuthal gas distribution.

The gas injection inserts 146 facilitate the location of the injection nozzles 148 in the concave surface 156 of the top gas ring 140. Gas injection from the side is optimized because the injection nozzles 148 are located in the concave surface 156 of the top liner ring 140, and the injected gas is guided by the concave surface 156. The top gas ring 140 and the injection nozzles 148 are located in a plane above the gas delivery ring 144 containing the four pairs of recursive gas flow channels 136, 138. Gas flow paths spanning the gap between the plane of the injection nozzles 148 and the gas delivery ring 144 are provided by the gas delivery inserts 146.

Figure 21:
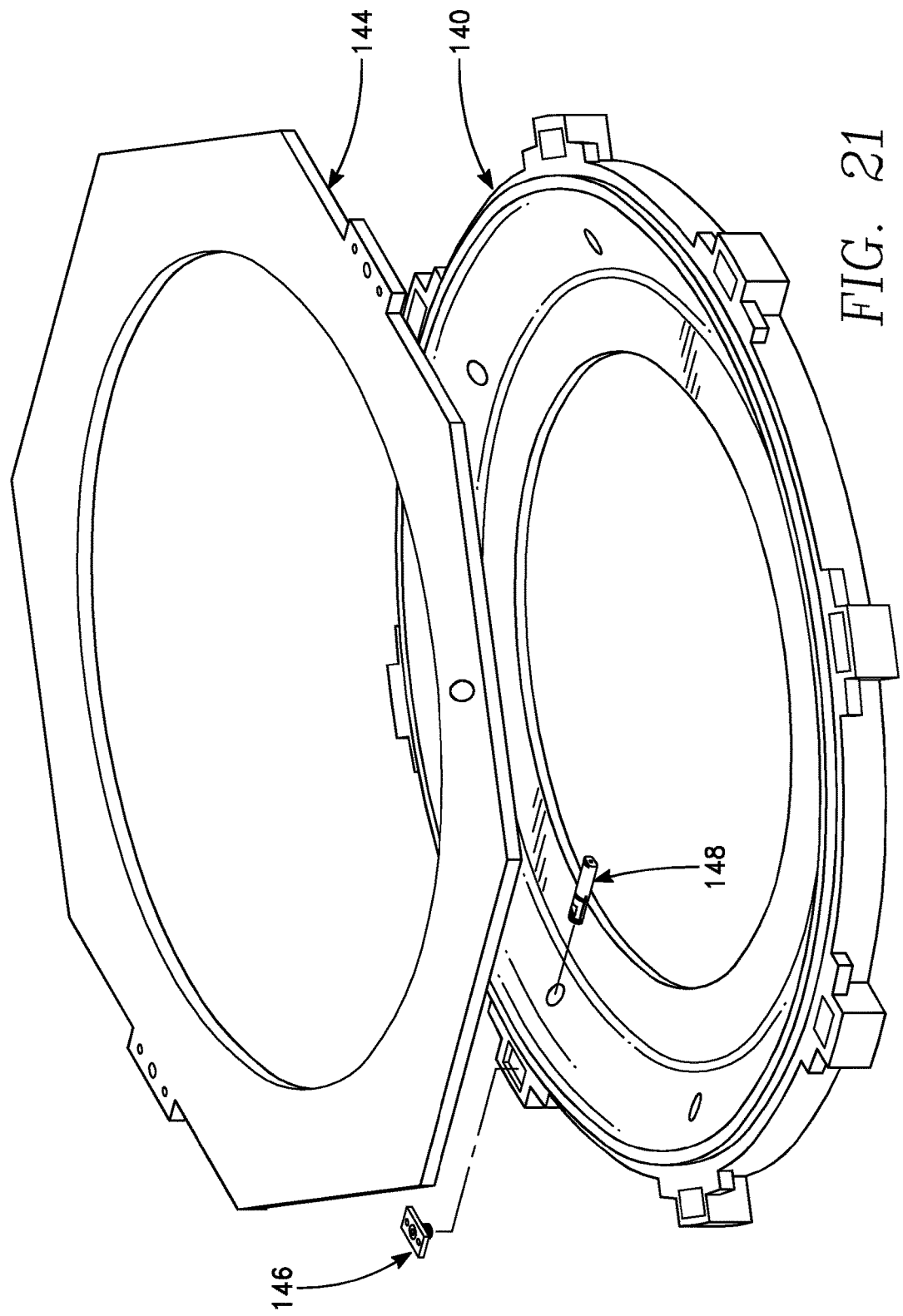
FIG. 21 depicts an exploded assembly of the gas distribution ring, the top liner ring, the injection nozzles and the gas distribution inserts of FIG. 4.

Referring to FIGS. 21 and 22, the top liner ring 140, the gas delivery ring 144, the eight gas delivery inserts 146 and the eight injection nozzles 148 are separate pieces, which enables the selection of materials to be optimized for each individual piece, and facilitates an efficient modular assembly. In an embodiment, the gas delivery ring 144 comes into contact with process gases but not with plasma. They are therefore formed of a ceramic material (or stainless steel or other suitable material) that is compatible with process gases employed in plasma processes such as a plasma enhanced reactive ion etch process, or plasma enhanced chemical vapor deposition process, as some examples. The injection nozzles 148 face the plasma processing zone of the chamber, and therefore are formed of a material, such as a ceramic material, that is compatible with exposure to plasma. The top liner ring 140 and the bottom liner 142 may be formed of a material which is not generally compatible with exposure to plasma. To avoid exposure of the material to plasma, the interior surface of the side wall 102 and the annular bottom surface 156 of the top liner ring 140 are covered with a protective layer compatible with exposure to plasma. The side wall 102 and the top liner ring 140 may be formed of aluminum, and their protective coatings may comprise Yttria or may be formed by anodization.

The modular parts may be conveniently and repetitively assembled and disassembled in the manner depicted in FIGS. 21 and 22 without damage to the various parts, while permitting a close fitting between parts, due in part to the protection afforded by the O-rings referred to above. Specifically, the O-rings 194 of FIG. 6 protect the injection nozzles 148 during their insertion in the nozzle pockets 164. The O-rings 209 on the gas delivery inserts 146 protect the injection nozzles 148 from the gas delivery inserts during insertion of the inserts 146 into the insert-receiving holes 186 in the injection nozzles 148. The O-rings 194 and 209 are elastically compressible in one embodiment.

Assembly procedure in FIGS. 21 and 22 entails inserting the injection nozzles 148 into the nozzle pockets 164 in the top liner ring 140, mounting the gas delivery inserts 146 on the gas delivery ring 144, and then bringing the gas delivery ring 140 and the top liner ring 140 together so as to insert the gas delivery inserts 146 into the respective insert-receiving holes 186.

While the illustrated embodiment exemplifies four-way symmetry involving eight injection nozzles 148, other symmetries may be employed involving a different number of injection nozzles 148.

While the foregoing is directed to embodiments of the present invention, other and further embodiments of the invention may be devised without departing from the basic scope thereof, and the scope thereof is determined by the claims that follow.

What is claimed is:
1. A plasma reactor comprising:
   a chamber, a tunable gas nozzle coupled to said chamber and a side gas plenum around said chamber;
   a plurality of N gas inlets coupled to said side gas plenum, and plural side gas outlets extending radially from said side gas plenum;

an N-way gas flow ratio controller having N outputs coupled to said N gas inlets respectively; and an M-way gas flow ratio controller having an input configured to be coupled to a process gas source and M outputs, respective ones of said M outputs coupled to said tunable gas nozzle and a gas input of said N-way gas flow ratio controller.

2. The plasma reactor of claim 1 wherein said tunable gas nozzle has two gas inputs coupled to two of said M outputs, and wherein M is three and N is four.

3. The plasma reactor of claim 1 further comprising:
a gas supply panel coupled to a gas input of said M-way gas flow controller.

4. The plasma reactor of claim 3 further comprising:
a process controller coupled to said M-way gas flow ratio controller and to said N-way gas flow ratio controller; and
a user interface coupled to said process controller.

5. The plasma reactor of claim 1 wherein said side gas plenum comprises plural sets of gas flow channels, each one of said sets of gas flow channels comprising:
an arcuate gas distribution channel having a pair of ends coupled to a corresponding pair of said plural side gas outlets; and
an arcuate gas supply channel, one end of said arcuate gas supply channel connected to a corresponding one of said plurality of N gas inlets, and an opposite end of said arcuate gas supply channel coupled to said gas distribution channel near a middle point of said gas distribution channel.

6. The plasma reactor of claim 5 wherein said plural sets of gas flow channels are of equal path lengths.

7. The plasma reactor of claim 5 wherein said chamber comprises a chamber interior and said side gas plenum comprises a liner edge, said plasma reactor further comprising:
a gas delivery ring over said liner edge, said plural sets of gas flow channels being formed in said gas delivery ring; and
a top liner ring over said gas delivery ring, said plural side gas outlets extending into said top liner ring, said top liner ring comprising a top liner ring surface facing said chamber interior.

8. The plasma reactor of claim 7 wherein each of said plural side gas outlets comprises:
a side gas injection nozzle extending radially within said top liner ring toward said chamber interior and comprising an axially extending gas delivery insert-receiving hole; and
a gas delivery insert extending from said gas delivery ring into said axially extending gas delivery insert-receiving hole.

9. The plasma reactor of claim 8 further comprising:
an axial internal gas flow passage in said gas delivery insert and a radial internal gas flow nozzle passage through a side wall of said axially extending gas delivery insert-receiving hole, said axial internal gas flow passage being in registration with said radial internal gas flow nozzle passage.

10. The plasma reactor of claim 9 wherein:
said top liner ring comprises plural nozzle pockets in said top liner ring surface, said side gas injection nozzle extending into a corresponding one of said nozzle pockets; and
said side gas injection nozzle comprises plural O-ring nozzle grooves concentric with said side gas injection nozzle, said plasma reactor further comprising first plural O-rings in said plural O-ring nozzle grooves compressed against an interior side wall of a corresponding one of said nozzle pockets.

11. The plasma reactor of claim 10 wherein said side gas injection nozzle further comprises:
a cylindrical outer nozzle surface, wherein said O-ring nozzle grooves define nozzle groove surfaces indented with respect to said cylindrical outer nozzle surface; and
an axial evacuation slot comprising: (a) slot sections in said cylindrical outer nozzle surface extending from an end of said side gas injection nozzle inside said nozzle pocket, and (b) slot sections in said nozzle groove surfaces.

12. The plasma reactor of claim 11 further comprising a gap between said cylindrical outer nozzle surface and said interior side wall of a corresponding one of said nozzle pockets.

13. The plasma reactor of claim 12 each of said plural gas outlets further comprises an axial port in said gas delivery ring extending to said axial internal gas flow passage of said gas delivery insert.

14. The plasma reactor of claim 10 wherein:
each of said side gas injection nozzles comprises a ceramic material, and said gas delivery ring and each of said gas delivery inserts comprise steel;
said top liner ring and said interior side wall comprises a protective layer comprising an anodized material or Yttria.

15. The plasma reactor of claim 10 wherein:
said top liner ring further comprises plural gas delivery insert pockets facing said gas delivery ring, a portion of said gas delivery insert extending into a corresponding one of said gas delivery insert pockets;
said gas delivery inert comprises plural O-ring insert grooves concentric with said gas delivery insert, said plasma reactor further comprising second plural O-rings in said plural O-ring insert grooves compressed against an interior side wall of a corresponding one of said plural gas delivery insert pockets.

16. A side gas injection kit, comprising:
a top liner ring comprising plural nozzle pockets and plural gas delivery insert pockets;
plural side gas injection nozzles extending into said nozzle pockets, each of said plural side gas injection nozzles comprising:
a cylindrical outer nozzle surface and plural O-ring nozzle grooves in said outer nozzle surface and concentric with said side gas injection nozzle;
first plural O-rings in said plural O-ring nozzle grooves compressed against an interior side wall of a corresponding one of said nozzle pockets; and
plural gas delivery inserts extending into said gas delivery insert pockets, each of said gas delivery inserts comprising:
plural O-ring insert grooves concentric with said gas delivery insert, and
second plural O-rings in said plural O-ring insert grooves compressed against an interior side wall of a corresponding one of said plural gas delivery insert pockets.

17. The side gas injection kit of claim 16 wherein each of said side gas injection nozzles further comprises:
nozzle groove surfaces indented with respect to said outer nozzle surface and formed in said O-ring nozzle grooves;
an axial evacuation slot comprising slot sections in said cylindrical outer nozzle surface extending from an end of said side gas injection nozzle inside said nozzle pocket, and slot sections in said nozzle groove surfaces.

18. The side gas injection kit of claim 17 further comprising a gap between said cylindrical outer nozzle surface and an interior side wall of a corresponding one of said nozzle pockets, said slot sections in said nozzle groove surfaces providing an evacuation path around said first plural O-rings, said slot sections in said cylindrical outer nozzle surface providing an evacuation path to said gap.

19. The side gas injection kit of claim 16 wherein:
each of said side gas injection nozzle comprises a ceramic material, each of said gas delivery inserts comprises steel, and said top liner ring comprises a protective layer comprising an anodized material or Yttria.

20. A side gas injection nozzle for placement into a nozzle pocket of a top liner ring, the side gas injection nozzle comprising:
a cylindrical body having an outer nozzle surface;
a gas injection passage forming an orifice at a radially inner end of the cylindrical body;
an axially extending gas delivery insert hole extending through the cylindrical body near a radially outer end of the cylindrical body;
an internal radial nozzle gas flow passage that extends through the cylindrical body from the axially extending gas delivery insert hole to the gas injection passage;
a plurality of O-ring nozzle grooves in said outer nozzle surface and concentric with the cylindrical body; and
an axial evacuation slot comprising slot sections in the outer nozzle surface extending from the radial outer end of the cylindrical body to the O-ring nozzle grooves.

21. The side gas ejection nozzle of claim 20, wherein the axial evacuation slot includes a first axial slot section extending between the radial outer end of the cylindrical body and a first of the plurality of O-ring nozzle grooves.

22. The side gas ejection nozzle of claim 21, wherein the axial evacuation slot includes a second axial slot section in the outer nozzle surface extending from the first of the plurality of O-ring nozzle grooves to a second the plurality of O-ring nozzle grooves.

23. The side gas injection nozzle of claim 22, wherein the axial evacuation slot comprises a third axial slot section in the outer nozzle surface extending for a short distance from the second of the plurality of O-ring nozzle grooves toward the radial inner end of the cylindrical body.

24. The side gas injection nozzle of claim 22, wherein the axial evacuation slot comprises a first grove axial slot section formed in an inner nozzle groove surface of the first of the O-ring nozzle grooves and a second grove axial slot section formed in an inner nozzle groove surface of the second of the O-ring nozzle grooves, said slot sections in said nozzle groove surfaces providing an evacuation path around plural O-rings in the plural O-ring nozzle grooves.

25. The side gas injection nozzle of claim 20, wherein the side gas injection nozzle comprises a ceramic material.

26. The side gas injection nozzle of claim 20, comprising a plurality of O-rings in said plural plurality of O-ring nozzle grooves to be compressed against an interior side wall of said nozzle pocket.

27. The side gas injection nozzle of claim 20, wherein the axially extending gas delivery insert hole is positioned between a first and a second of the plurality of O-ring nozzle grooves.

* * * * *